US009539736B2

(12) United States Patent
Schwartz et al.

(10) Patent No.: US 9,539,736 B2
(45) Date of Patent: Jan. 10, 2017

(54) MECHANICAL METHOD FOR PRODUCING MICRO- OR NANO-SCALE TEXTURES

(75) Inventors: David Eric Schwartz, San Carlos, CA (US); Matthew D. Eisaman, Port Jefferson, NY (US); Sourobh Raychaudhuri, Mountain View, CA (US); Philipp H. Schmaelzle, Los Altos, CA (US); Robert A. Street, Palo Alto, CA (US); Sean Garner, San Francisco, CA (US); Baomin Xu, San Jose, CA (US); Jiye Lee, Cambridge, MA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 1192 days.

(21) Appl. No.: 13/569,153

(22) Filed: Aug. 7, 2012

(65) Prior Publication Data

US 2014/0041504 A1 Feb. 13, 2014

(51) Int. Cl.
*B24B 1/00* (2006.01)
*B26D 3/08* (2006.01)
*B26D 3/06* (2006.01)

(52) U.S. Cl.
CPC . *B26D 3/08* (2013.01); *B26D 3/06* (2013.01); *H01L 2251/105* (2013.01); *Y10T 83/0333* (2015.04); *Y10T 83/0341* (2015.04)

(58) Field of Classification Search
CPC .................................. B24B 1/00; B26D 3/08
USPC .............................. 451/28, 41, 63
See application file for complete search history.

(56) References Cited

U.S. PATENT DOCUMENTS

| 6,171,176 B1 * | 1/2001 | Kajiyama | B24B 13/00 451/128 |
| 2011/0126890 A1 * | 6/2011 | Borrelli | H01L 31/0236 136/255 |

OTHER PUBLICATIONS

Atwater, Harry A. and Albert Polman, "Plasmonics for improved photovoltaic devices", Nature Materials, vol. 9, Feb. 19, 2010, pp. 205-213.
Ding, I-Kang, et al. "Plasmonic Dye-Sensitized Solar Cells", Advanced Energy Materials, 2011, vol. 1, pp. 52-57.
Ferry, Vivian E., et al. "Plasmonic Light Trapping for Thin Film a-Si:H Solar Cells," Proceedings of the 35th IEEE Photovoltaics Specialist Conference, Honolulu, Hawaii, Jun. 20-25, 2010, 6 pages.
(Continued)

*Primary Examiner* — Robert Rose
(74) *Attorney, Agent, or Firm* — Bever, Hoffman & Harms, LLP

(57) ABSTRACT

A mechanical method for producing micro-scale and nano-scale textures that facilitates, for example, the cost-effective production of nanostructures on large-scale substrates, e.g., during the large-scale production of thin-film solar cells. A "scratcher" (multi-pointed abrasion mechanism) is maintained in a precise position relative to a target substrate such that micron-level features (protrusions) extending from the scratcher's base structure are precisely positioned to contact a surface material layer of the target substrate with a predetermined amount of force, and then moved relative to the substrate (e.g., by way of a conveying mechanism) while maintaining the pressing force such that the micron-level features define elongated parallel nano-scale grooves and/or form nano-scale ridges in the surface material layer (i.e., by mechanically displacing) portions of the surface material layer to form the nano-scale grooves/ridges).

18 Claims, 12 Drawing Sheets

(56) References Cited

OTHER PUBLICATIONS

Ferry, Vivian E., et al. "Plasmonic Nanostructure Design for Efficient Light Coupling into Solar Cells," NanoLetters, 2008, vol. 8, No. 12, pp. 4391-4397.
Henzie, J., et al. "Nanofabrication of Plasmonic Structures," Annual Review of Physical Chemistry, 2009, 60, pp. 147-165.
Mehta, Shyam, "Understanding Thin Film Prices: A Dummy's Guide," Greentech Media, Nov. 29, 2010, 6 pages, http://www.greentechmedia.com/articles/read/what-governs-thin-filmmodule-prices/.
Pillai, S., et al. "Surface plasmon enhanced silicon solar cells," Journal of Applied Physics 101, 2007, 093105 (9 pages).
Saeta, Peter N., et al. "How much can guided modes enhance absorption in thin solar cells?" Optics Express, vol. 17, No. 23, Nov. 9, 2009, pp. 20975-20990.
Basic Research Needs for Solar Energy Utilization: Report of the Basic Energy Sciences Workshop on Solar Energy Utilization, Apr. 18-21, 2005, pp. Title Page-xii, http://www.er.doe.gov/bes/reports/files/SEU_rpt_print.pdf.

\* cited by examiner

MECHANICAL METHOD FOR PRODUCING MICRO- OR NANO-SCALE TEXTURES

FIELD OF THE INVENTION

This invention relates to methods for generating fine textures (features) on a metal or other surface, and in particular to methods for generating micro-scale and nano-scale structures during the production of solar cells.

BACKGROUND OF THE INVENTION

One approach to improving the efficiency of solar cells is by employing micro- or nano-structures to enhance light collection. Such structures can be used to redirect sunlight incident over a wide range of incident angles into guided optical modes in the semiconductor. This makes the direction of light propagation orthogonal to the direction relevant to carrier diffusion, allowing large absorption efficiency and large carrier collection efficiency in the same device.

For certain choices of materials and structures, incident light can also excite surface plasmon resonances (SPRs) in metal-semiconductor interfaces in the solar cell. SPRs increase absorption by acting as sub-wavelength antennas with a plasmonic nearfield that is coupled to the semiconductor layer. Moreover, SPRs enhance the coupling of energy into in-plane photonic as well as surface plasmonic modes.

In order for the improved efficiency and reduced material thickness of such cells to dramatically reduce the cost per watt of electricity generated from these cells, what is needed is a method for fabricating the nanostructure "textures" (i.e., grooves or ridges) that is low-cost, high-throughput and compatible with roll-to-roll processing techniques (i.e., can be integrated into standard high-volume solar-cell manufacturing processes). One way to efficiently scatter the wavelengths of light that make up the solar spectrum is with nanostructure textures that have at least one dimension similar or smaller to the wavelength of the incident light. Examples of such textures include grooves or ridges with height and/or depth of approximately 50-100 nm. A scalable, low-cost method to produce such textures is desirable.

SUMMARY OF THE INVENTION

The present invention is generally directed to a mechanical method for producing micro-scale and nano-scale textures (i.e., structural features ranging from sub-micron to a few micron in size, collectively referred to herein either as "textures" or "nanostructures") that facilitates, for example, the cost-effective production of optically resonant nanostructures on large-scale substrates, e.g., during the large-scale production of thin-film solar cells. The method generally includes disposing a "scratcher" (multi-pointed abrasion mechanism) in a precise position relative to a target substrate such that micron-level features (i.e., protrusions ranging from sub-micron to a few micron in size) extending from the scratcher's base structure are precisely positioned to contact a surface material layer disposed on (or integrally part of) the substrate with a predetermined amount of force (e.g., determined by the type of surface material and/or the type of scratcher), and then moving the scratcher relative to the substrate (e.g., by way of a conveying mechanism) while maintaining the pressing force such that the micron-level features define elongated parallel nano-scale grooves and/or form nano-scale ridges in the surface material layer (i.e., by mechanically displacing) portions of the surface material layer to form the nano-scale grooves/ridges). The present invention presents a low-cost solution to the problems associated with conventional methods for producing surface plasmon resonances (SPRs) by providing a process that is scalable to high-volume, high-throughput (e.g., roll-to-roll) solar cell manufacturing, and is also capable of producing nanostructures within a strict size tolerance (e.g., approximately 50 nm). The present invention is currently believed to be especially applicable to the high-volume production of thin-film photovoltaic solar cells produced using roll-to-roll techniques on flexible metal sheets (or thin metal layers formed on flexible substrates), where one of the scratcher structures described herein is added to an existing process line and set to create micro-scale or nano-scale textures (e.g., plasmonic structures) by scratching the metal sheet/layer as it is fed roll-to-roll during the production process. However, the method of the present invention is also believed to be applicable to a wider range of functional uses, and therefore is not limited to the production of solar cells and nanostructure textures unless otherwise specified in the appended claims.

In accordance with a practical embodiment of the present invention, the scratcher is supported in a substantially stationary position over the surface of the target substrate while a conveying mechanism (e.g., a conveyor belt or roll-to-roll drive mechanism) causes the substrate to move horizontally under the scratcher. Alternatively, the substrate is maintained in a stationary position and the scratcher is moved horizontally over the substrate. In either case, the scratcher is connected to and supported by a positioning mechanism that includes a pressure application mechanism (e.g., a pneumatic piston) for biasing (pressing) the scratcher against the substrate (or the substrate against the scratcher) such that the micron-level features apply a predetermined force against the surface material layer. In one embodiment the positioning mechanism also includes a sensing mechanism (e.g., a pressure sensor) that precisely measures the applied force and generates adjustment control signals such that the applied force F is maintained at a constant level while the scratcher is moved relative to the substrate, whereby the scratcher produces substantially uniform nanostructures on the target substrate that are sub-micron in scale.

The present invention may be implemented using various types of scratchers. In accordance with an exemplary embodiment of the present invention, the base structure of the scratcher is made up of a rigid substrate material (e.g., Si), and the micron-level features are formed by patterning (e.g., etching by way of a mask) portions of the rigid substrate material disposed on a frontside surface of the rigid substrate material. In another embodiment the base substrate is a flexible material (e.g., a polymer sheet), and the micron-level features comprise grains of a hard material (e.g., diamond or $SiO_2$) that are embedded in or otherwise adhered to the flexible substrate material. In yet another embodiment, the base substrate is a crystal material (such as monocrystalline silicon), and the micron-level features are exposed vertices of the crystal material formed by anisotropically etching the crystalline base substrate material. In some embodiments, the micron-level features are arranged in a single row or otherwise spaced apart in the process (scratching) and have cross-sectional shapes such that they form spaced-apart grooves with a triangular, trapezoidal, or rectangular cross-section a depth in the range of 10 nm and 500 nm and a width in the range of 5 nm and 5 μm. In other embodiments, the micron-level features are arranged in a matrix or otherwise spaced closely together in the process direction, whereby V-shaped ridges are formed having a height in the range of 10 nm and 2 μm and a width in the range of 10 nm and 2 μm.

According to alternative embodiments of the present invention, the method either includes an additional procedure for removing debris that may be generated during the scratching process, or modified to avoid (prevent) debris from forming during the scratching process. Debris removal is achieved, for example, by applying and removing an adhesive film, etching, ultrasonic agitation, rubbing with a soft material or fine polishing pad, heat treatment, high pressure fluid jet, flattening with a plate or a roller, or modifying the scratching element such that it removes the debris as it scratches, for example, using a knife edge disposed on the sides of the scratcher. Alternatively, the formation of debris is suppressed or avoided by performing the scratching process at elevated temperatures, or scratching through a protective layer, such as a photoresist coating.

According to another practical embodiment of the present invention, the scratching process is incorporated into a production process in which the substrate is implemented on a flexible sheet disposed in a roll-to-roll arrangement and the scratcher is maintained in a stationary position between the rolls, wherein moving the scratcher relative to the substrate occurs as the flexible sheet is fed from the first roller to the second roller, whereby a portion of the flexible sheet passing under the scratcher is processed as described above. This arrangement facilitates the addition of the present invention into an existing high-throughput production line utilized to produce, for example, solar cells, by facilitating one or more processes to be performed before and after the scratching process. For example, in one embodiment a second material layer is deposited on a portion of the flexible sheet located downstream from the scratcher that fills the elongated parallel nanostructure grooves and forms a functional layer over the surface material layer. In one embodiment, one or more "plasmonic" metals (e.g., Ag, Au, Al, and Cu) are disposed over the flexible sheet or otherwise form the surface material "scratched" layer, and the "second" material is a photovoltaic material (e.g., a-Si) that is deposited over the plasmonic metal in a way that forms a photoabsorber layer, and an optional transparent electrode material (e.g., ITO) is then formed over the photoabsorber layer. In yet another embodiment, the surface material layer is a semiconductor material layer (e.g., CdTe or organic semiconductor) disposed on a transparent conductive layer (e.g., ITO), and the second material is a metal (e.g., Ag) deposited over the semiconductor material layer such that the metal fills elongated parallel nanostructure grooves and forms a back contact layer over the semiconductor material layer.

In accordance with another specific "solar cell production" embodiment, the methods described herein are utilized to form an ordered heterojunction organic solar cell by scratching the heterojunction interface. This embodiment begins by forming a first organic electronic material (e.g., donor) layer (e.g., spin-coat polymer or evaporated small molecules) on a transparent electrode layer (e.g., ITO) that is disposed on a base substrate. The subtractive "scratching" method described herein is then performed to scratch portions of the donor layer. A second organic electronic material (e.g., acceptor) layer is then formed (e.g., a spin-cast polymer or evaporated small molecules) over the scratched surface to complete ordered heterojunction structure, and then a back electrode layer (e.g., a metal) is then formed on the second layer. A benefit of forming ordered heterojunction organic solar cell with nano-scale textures using the methodology of the present invention over conventional ordered heterojunction organic solar cells is that it allows for more efficient carrier extraction.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

The present invention relates to an improved method for generating micro-scale and nano-scale textures. The following description is presented to enable one of ordinary skill in the art to make and use the invention as provided in the context of a particular application and its requirements. As used herein, directional terms such as "upper", "upwards", "lower", "downward", "front", "rear", are intended to provide relative positions for purposes of description, and are not intended to designate an absolute frame of reference. In addition, the phrases "integrally connected" and "integrally molded" is used herein to describe the connective relationship between two portions of a single molded or machined structure, and are distinguished from the terms "connected" or "coupled" (without the modifier "integrally"), which indicate two separate structures that are joined by way of, for example, adhesive, fastener, clip, or movable joint. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
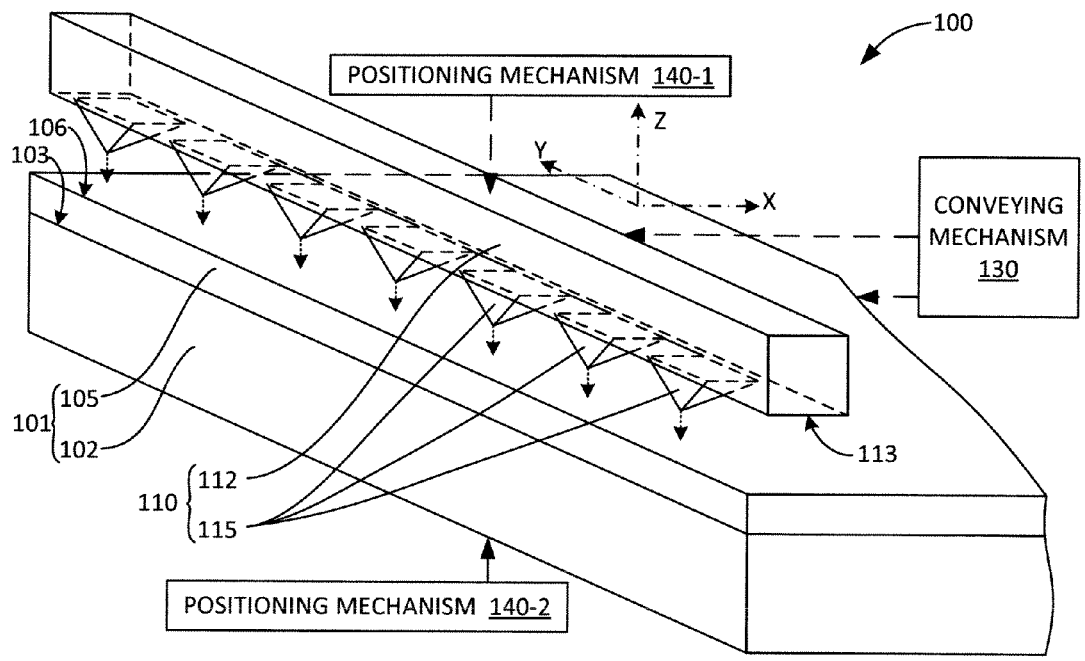
FIG. 1 is a partial top side perspective view showing a generalized assembly utilized to generate nano-scale textures according to an embodiment of the present invention.

FIG. 1 is a perspective view showing a simplified assembly 100 that is utilized to illustrate a mechanical method for producing micro-scale and nano-scale textures (i.e., structural features ranging from sub-micron to a few micron in size, also referred to herein as "textures" or "nanostructures") on a target substrate 101 in accordance with a generalized exemplary embodiment of the present invention. According to an aspect of the invention, the method utilizes a "scratcher" (i.e., a multi-pointed abrasion mechanism) 110 to generate the micro-scale and nano-scale textures on substrate 101, where scratcher 110 generally includes a base structure 112 and multiple micron-level features (i.e., protrusions that are sub-micron to a few microns in size) 115 that extend away from a lower surface 113 of base structure 112 (i.e., toward target substrate 101). In the exemplary embodiment, target substrate 101 includes a base layer 102 and a surface material layer 105 disposed on (i.e., either deposited on or integrally part of) an upper base region 103 of base layer 102. In alternative specific embodiments base layer 102 and material layer 105 are part of an integral material layer (e.g., surface material layer 105 is an uppermost layer of the semiconductor or metal material forming base layer 102), or base layer 102 comprises a first material (e.g., a semiconductor material, or a rigid or flexible non-semiconducting substrate material) and surface material layer 105 is a second material (e.g., a conductor or a second semiconductor material) that is formed on upper base region 103. In either case, an outer surface 106 defined by surface material layer 105 forms an outermost surface of substrate 101 that is pierced and otherwise processed by micron-level features 115 of scratcher 110 in the manner described below.

Figure 2A:
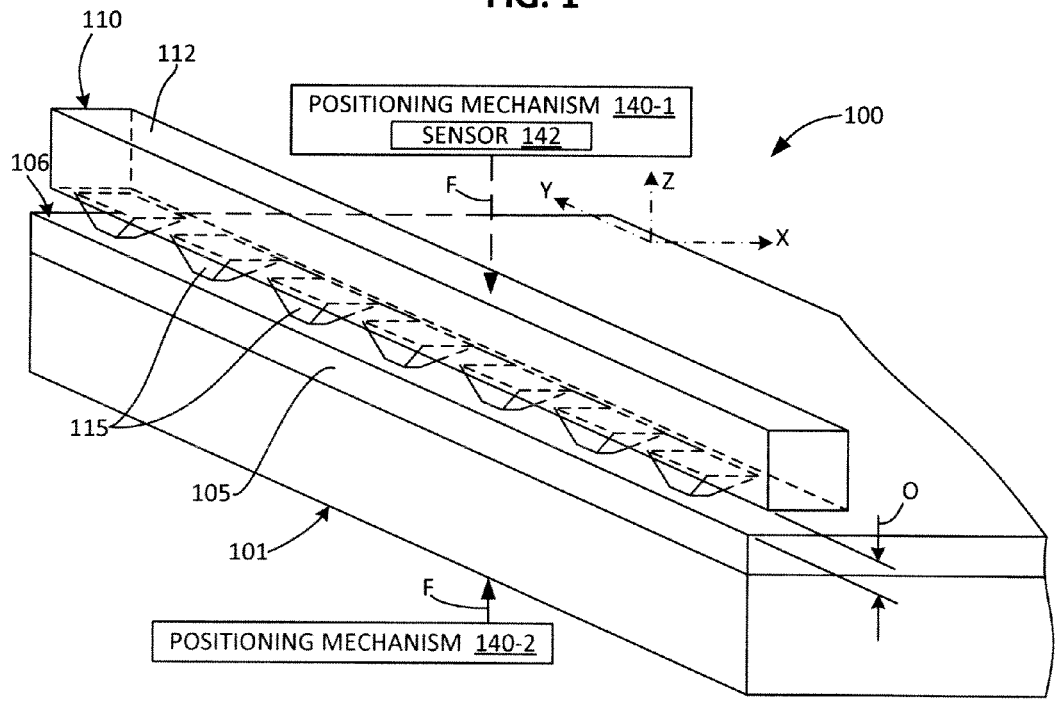
FIGS. 2(A) and 2(B) are partial top side perspective views showing the assembly of FIG. 1 during operation.
Figure 2B:
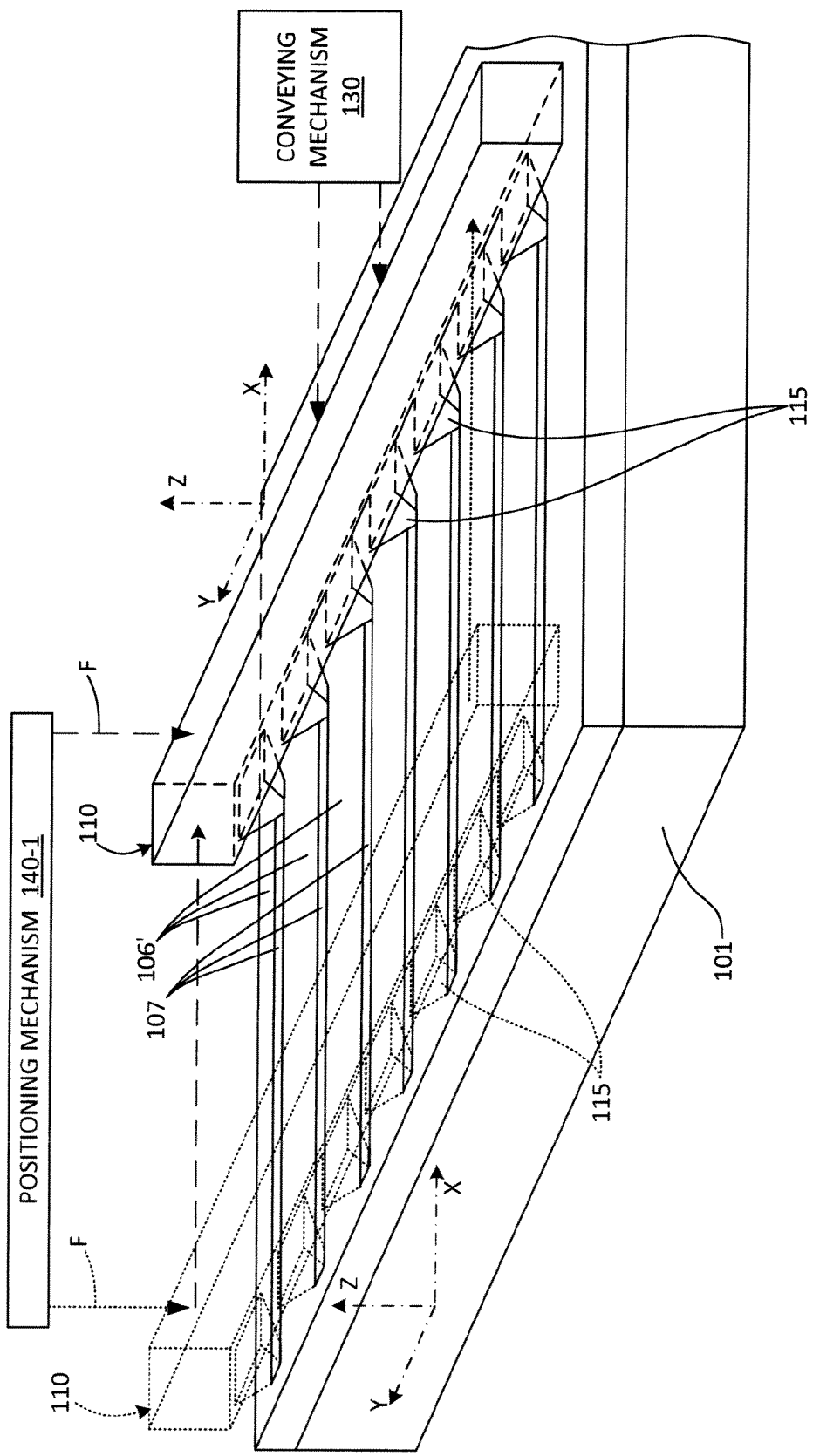

FIGS. 2(A) and 2(B) are perspective views illustrating a mechanical method for producing micro-scale and nano-scale textures utilizing assembly 100 of FIG. 1. FIG. 2(A) illustrates an initial process of pressing scratcher 110 downward (i.e., in a vertical direction opposite to the positive Z-axis direction) against substrate 101 such that micron-level features 115 pierce outer surface 106 of surface material layer 105. FIG. 2(B) illustrates moving scratcher 110 horizontally (i.e., in the X-axis direction) relative to substrate 101 such that micron-level features 115 displace (e.g., remove or push aside) portions of surface material layer 105 in a manner that produces parallel elongated grooves 107 separated by parallel surface sections (ridges) 106' (i.e., residual "unchanged" portions of outer surface 106).

Referring to the rightmost portions of FIGS. 1 and 2(B), relative movement between scratcher 110 and substrate 101 is achieved using a conveying mechanism 130. In accordance with a practical embodiment of the present invention, scratcher 110 is supported in a substantially stationary position over substrate 101, and conveying mechanism 130 (e.g., a conveyor belt or roll-to-roll drive mechanism) causes substrate 101 to move horizontally (i.e., in the X-axis direction) under stationary scratcher 110. In an alternative embodiment, relative movement between scratcher 110 and substrate 101 is achieved by maintaining substrate 101 in a substantially stationary (horizontal) position, and scratcher 110 is moved horizontally by way of conveying mechanism 130 over substrate 101.

Referring to FIGS. 1 and 2(A), assembly 100 utilizes one or more vertical positioning mechanisms 140-1 and 140-2 that precisely position scratcher 110 relative to target substrate 101 such that each micron-level feature 115 applies the desired biasing force F onto a corresponding portion of surface material layer 105. In accordance with a practical embodiment of the present invention, scratcher 110 is supported over substrate 101 by positioning mechanism 140-1 (e.g., a robotic arm or other XYZ positioning system) that facilitates precise positioning in the vertical (Z-axis) direction, and substrate 101 is maintained in a vertically fixed position relative to scratcher 110 by positioning mechanism 140-2 (e.g., a flat supported surface). In addition, positioning mechanism 140-1 includes a pressure application mechanism (e.g., a pneumatic piston, not shown) that presses scratcher 110 against substrate 101 with a desired biasing force F, which is determined, for example, by the type of surface material being processed, the type and arrangement of the scratcher features, and the size and depth of the desired grooves. As indicated in FIG. 2(A), in one embodiment positioning mechanism 140-1 also includes a sensor 142 that detects a relative position between substrate 101 and scratcher 110, and supplies position data to a system controller (e.g., a computer, not shown), whereby the position data is used to manipulate positioning mechanism 140-1 such that scratcher 110 is optimally positioned relative to substrate 101 (e.g., such that base structure 112 is maintained at an offset distance 0 from outer surface 106). In another embodiment, sensor 142 comprises a suitable force-measuring sensor that measures biasing force F and supplies associated force data to the system controller, whereby the force data is used to manipulate the pressure application mechanism on positioning mechanism 140-1 such that micron-level features 115 apply the desired biasing force F against surface material layer 105 while scratcher 110 is moved relative to substrate 101, whereby scratcher 110 produces substantially uniform nanostructures 106'/107 on substrate 101 (e.g., as depicted in FIG. 2(B)). In alternative embodiments, the pressure application mechanism and sensor 142 are placed on positioning mechanism 140-2.

Figure 3:
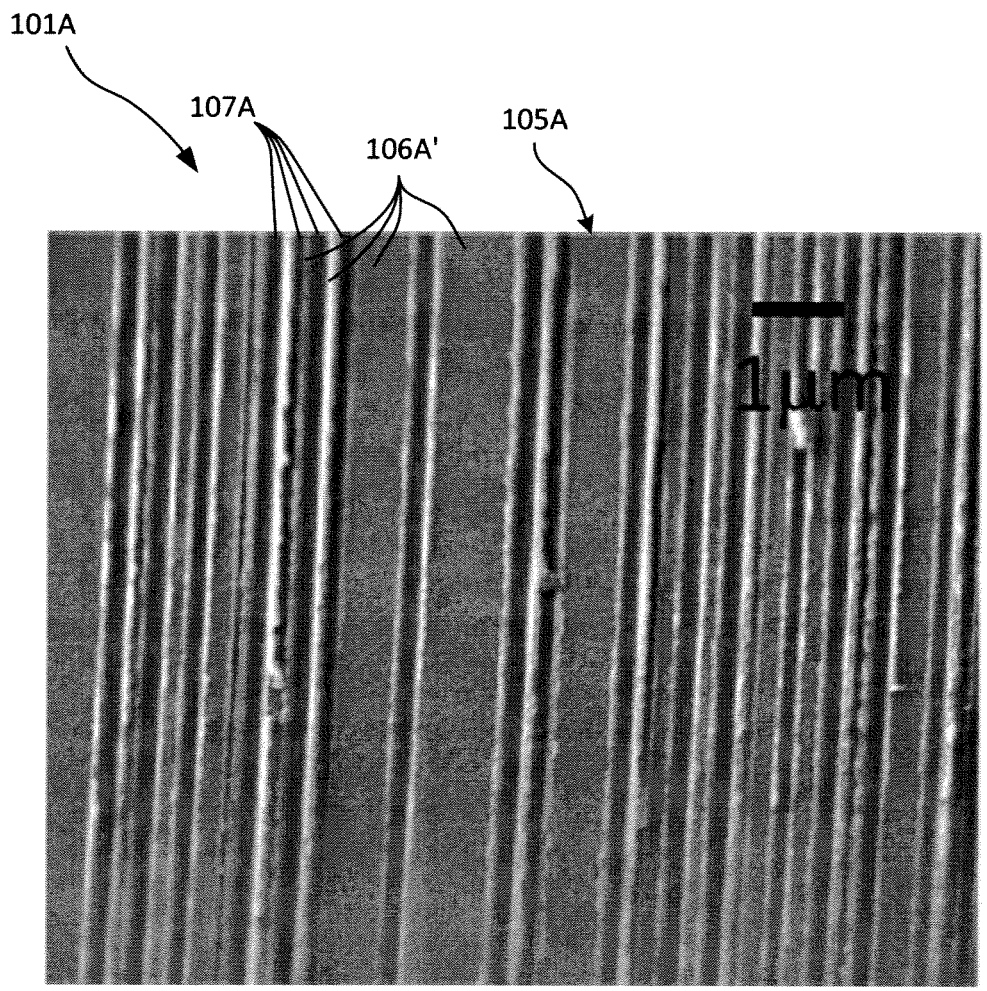
FIG. 3 is a scanning-electron micrograph showing nano-scale textures generated in accordance with the present invention.

FIG. 3 is a scanning-electron micrograph showing an exemplary substrate 101A that was processed using an experimental assembly similar to that described above and in accordance with the generalized method described herein. In particular, FIG. 3 shows multiple grooves 107A and intervening ridges 106A' formed in a surface material layer 105A of substrate 101A, where surface material layer 105A comprises a layer of gold. The "1 μm" scale marking superimposed on the image accurately depicts actual size of the generated nanostructures (i.e., grooves 107A and ridges 106A'), and clearly indicates that widths of the nanostructures (i.e., as measured in the horizontal direction in the photograph) are clearly sub-micron in scale.

Nanostructures similar to those shown in FIG. 3 may be produced in accordance with the present invention using any of the scratchers described in the following specific embodiments.

Figure 4:
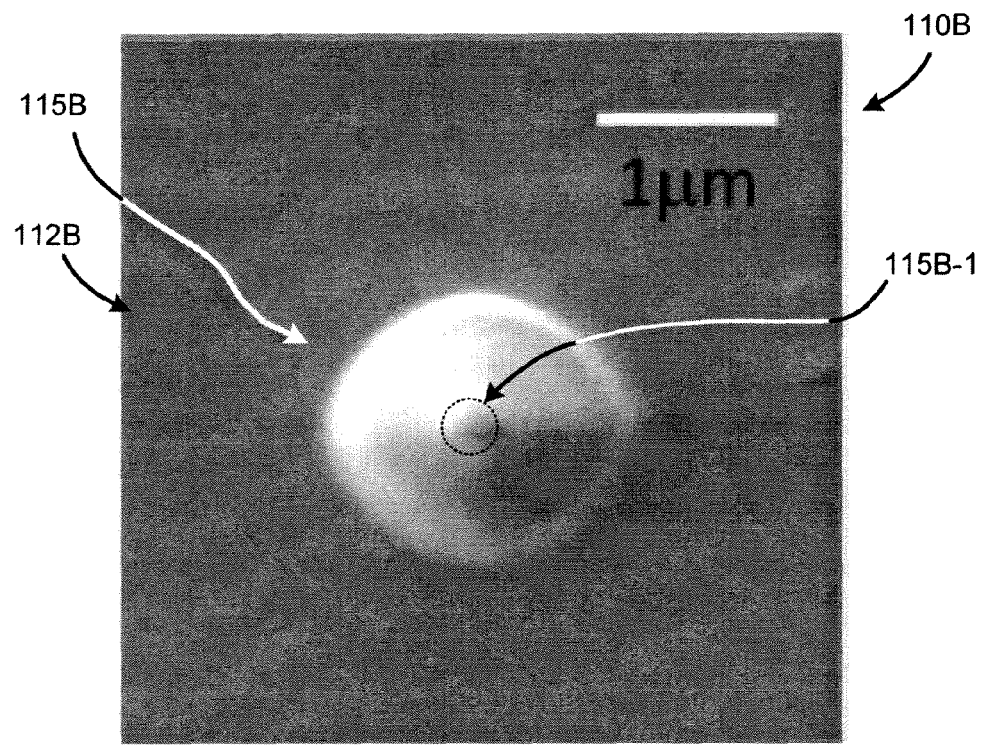
FIG. 4 is a scanning-electron micrograph showing the top of a micron-level scratcher feature utilized in accordance with an exemplary embodiment of the present invention.
Figure 5:
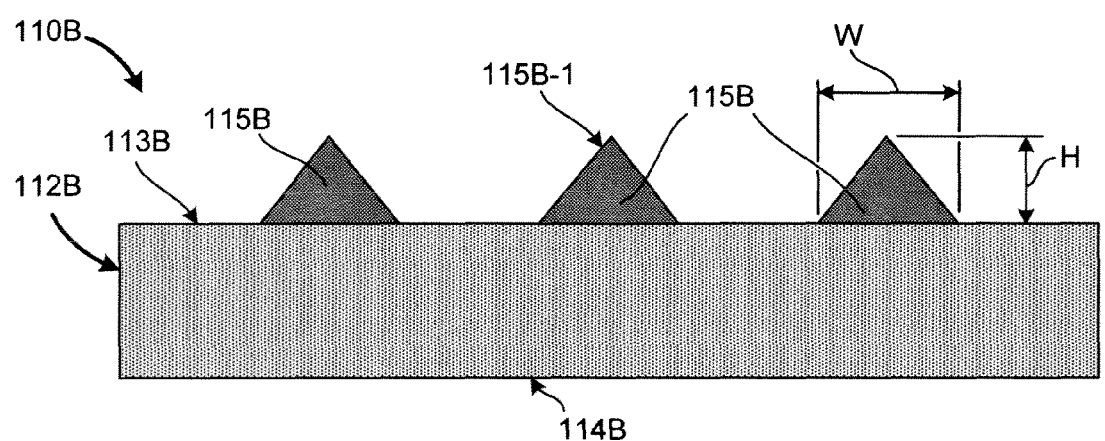
FIG. 5 is a cross-sectional side view showing the scratcher of FIG. 4 in additional detail.

FIGS. 4 and 5 depict a scratcher 110B, which illustrates a first type of scratcher in which base structure 112B is made up of a rigid substrate (e.g., a monocrystalline silicon wafer) and micron-level features 115B are patterned (e.g., lithographically processed or otherwise etched) portions of the rigid substrate material or an oxide layer that is disposed on a frontside surface 113B of the substrate. FIG. 4 is a top view showing a single exemplary micron-level feature 115B (i.e., a pointed structure) disposed on and extending upward (i.e., out of the drawing sheet) from a base structure 112B, and FIG. 5 is a cross-sectional side view depicting several micron-level features 115B extending upward from base structure 112B. In one embodiment, micron-level feature 115B comprise portions of the base material that are etched or otherwise formed using any of several known techniques including mask lithography, electron beam lithography, or interference lithography. In one specific embodiment, a photoresist material is coated on a substrate (e.g. Si, or $SiO_2$, $Al_2O_3$), patterned and developed with one of the above methods, and the substrate is etched using a wet (such as KOH for Si or BOE or HF for $SiO_2$) or dry etching method, such as RIE or ICP. Wet etching can have a further benefit of undercutting the photoresist to create sharper tip structures 115B-1. FIG. 5 is a cross-sectional side view showing multiple micron-level features 115B extending upward from front surface 113C, where the tip of each micron-level feature 115B has a width W in the range of 10 nm and 2000 nm, and a height H greater than the desired feature depth (e.g., 10 nm to 500 nm). During operation, base structure 112B of scratcher 110B is held by the positioning mechanism and pressed by way of backside surface 114B such that micron-level features 115B are biased toward the substrate (not shown).

Figure 6:
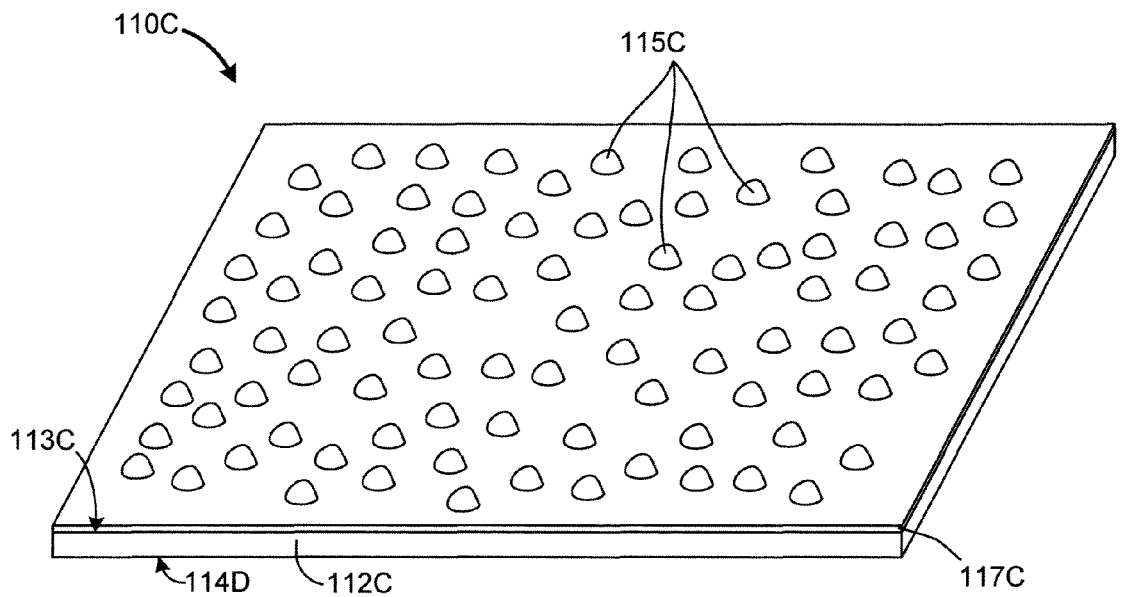
FIG. 6 is a top front perspective view showing a scratcher according to another exemplary embodiment of the present invention.

FIG. 6 illustrates a second type of scratcher 110C having a base substrate 112C that is a flexible substrate material (e.g. a thin sheet of polymer), where micron-level features 115C comprise grains of a hard material (e.g., diamond or $SiO_2$) that are embedded into or otherwise adhered to a front surface 113C of base substrate 112C, e.g., by way of an optional adhesive layer 117C. This "sandpaper" type of scratcher is preferably made such that grains 115C are relatively monodisperse and of the order of magnitude of the desired scratches (i.e., from 50 nm to 1 µm in diameter). Regular spacing of grains 115C requires aligning the grains in, for example, rows, which can be done by lithographically creating a structure with regular furrows. In another embodiment grains 115C are randomly placed—a lapping pad is an example of such a scratcher. In this case, one method of fabricating scratcher 110C is to mix the grains with a polymer and spin coat the grains on upper surface 113C. A benefit to using flexible base substrate 112C is that, when scratcher 110C is operably positioned and pressed via backside surface 114C against a target substrate (not shown), flexible base substrate 112C conforms to any irregularities existing on the target substrate surface (i.e., the surface being scratched), thereby forming more regular features despite any such surface non-uniformities. In another optional embodiment, the grains described above are secured to a rigid substrate.

Figure 7:
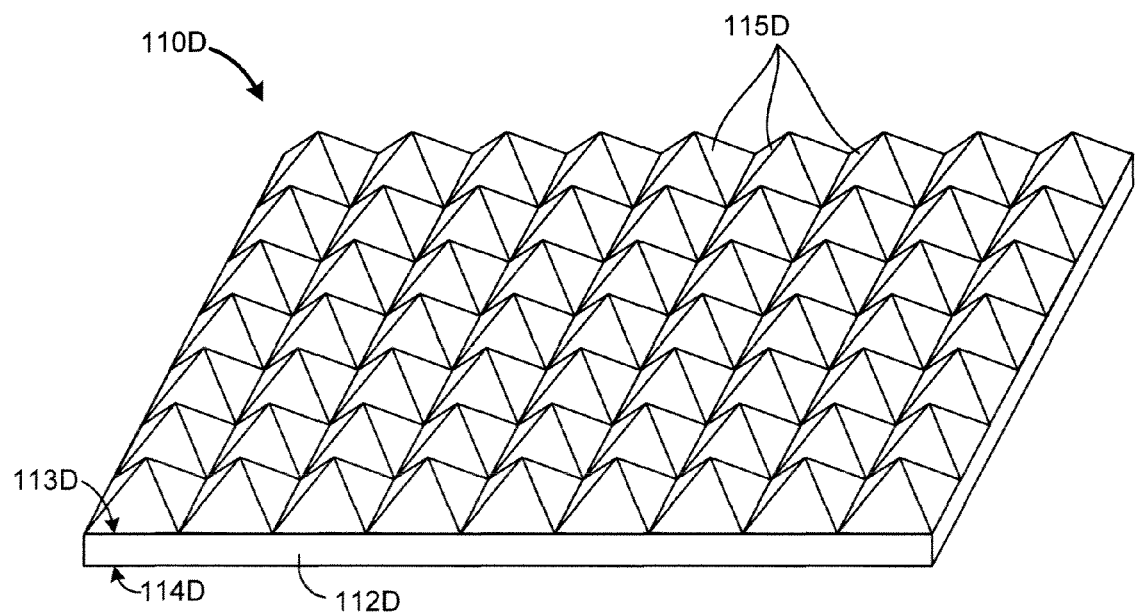
FIG. 7 is a top front perspective view showing a scratcher according to another exemplary embodiment of the present invention.

FIG. 7 illustrates a third type of scratcher 110D having a base substrate 112D that is formed by a single-piece crystal substrate (e.g., a monocrystalline Si wafer section), where micron-level features 115D comprise vertices (e.g., 111 vertices) of the crystalline structure that extend from front surface 113D of base substrate 112D. Crystals, such as silicon, have regular structures, and can be anisotropically etched so as to expose vertices of the crystal lattice. If a polished wafer is used, these vertices may be made to be very uniform (i.e., formed in rows and columns as indicated in FIG. 7).

Figure 8:
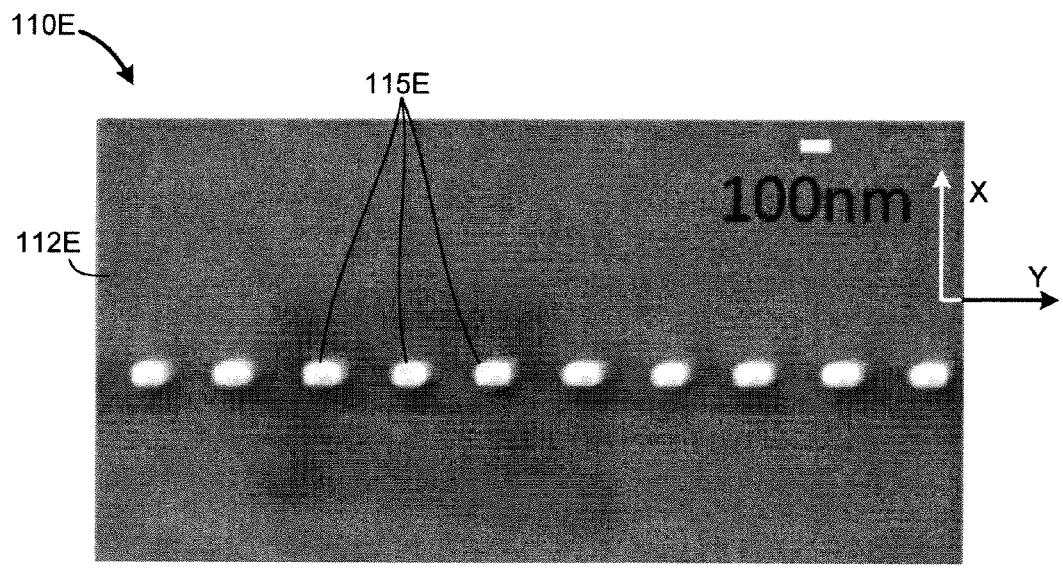
FIG. 8 is a scanning-electron micrograph showing the top of a scratcher utilized in accordance with another exemplary embodiment of the present invention.
Figure 9:
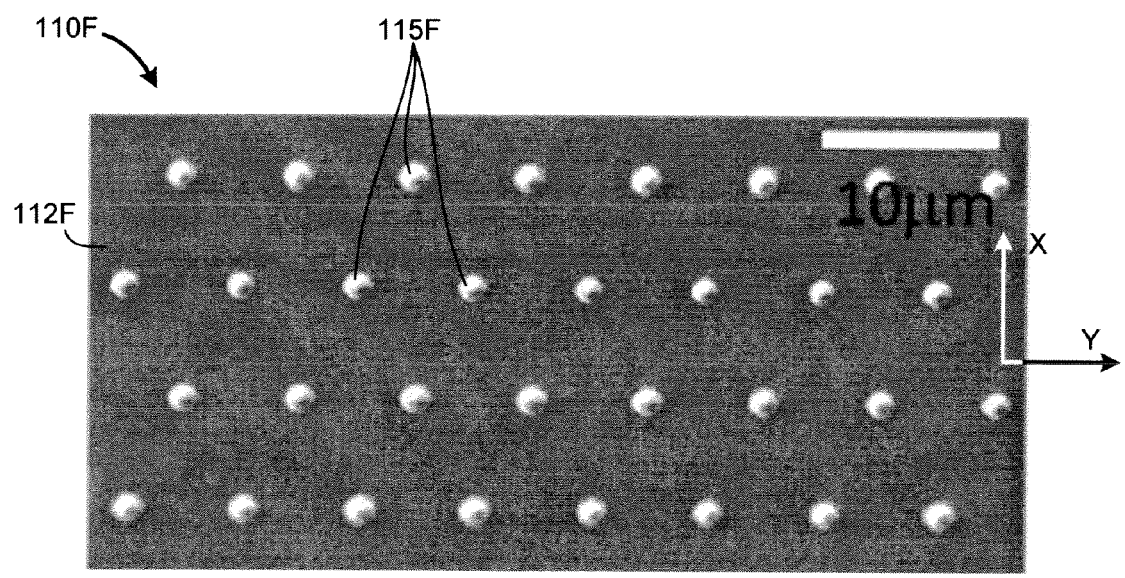
FIG. 9 is a scanning-electron micrograph showing the top of a scratcher utilized in accordance with yet another exemplary embodiment of the present invention.
Figure 10A:
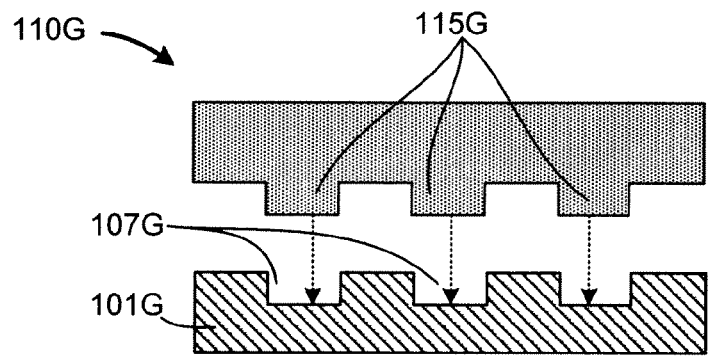
FIGS. 10(A), 10(B) and 10(C) are simplified cross-sectional side views showing scratcher features and associated textures produced in accordance with respective exemplary embodiments of the present invention.
Figure 10B:
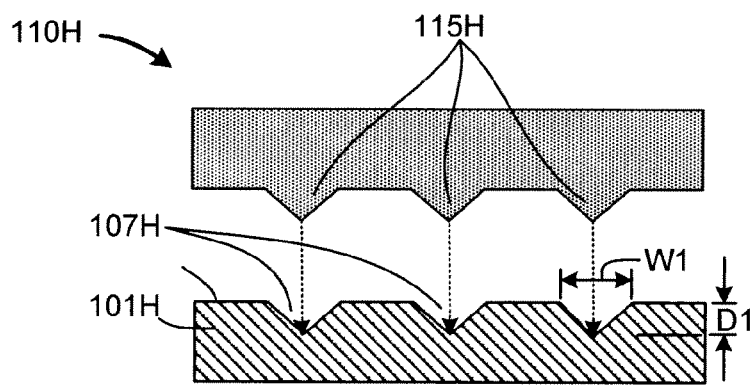
Figure 10C:
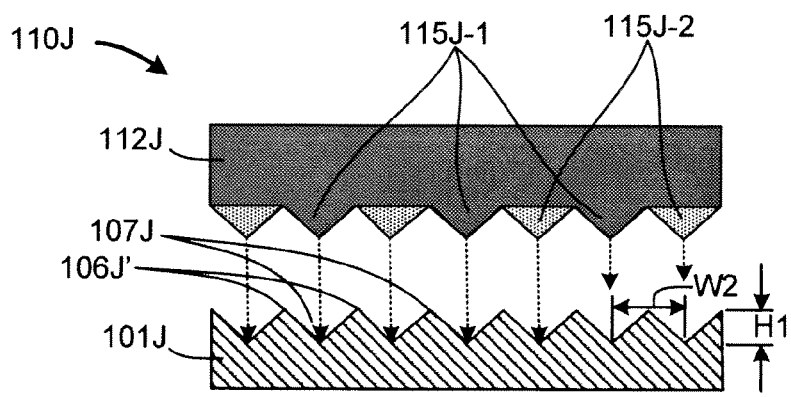

According to additional alternative embodiments of the present invention, the micron-level features of each scratcher are arranged either in a single row or in multiple rows. For example, FIG. 8 shows a scratcher 110E having multiple micron-level features 115E arranged in a single row on base structure 112E, whereby scratcher 110E is positioned over a target substrate (not shown) such that the row micron-level features 115E is aligned in the cross-process (Y-axis) direction, where the above-described relative movement between scratcher 110E and the target substrate takes place in the process (X-axis) direction. This single-row arrangement produces spaced-apart groove-type textures 107G and 107H similar to those described below with reference to FIGS. 10(A) and 10(B). In an alternative arrangement, scratcher 110E is aligned diagonally (e.g., at a 45° or other angle relative to the X- and Y-axis directions), thus reducing the effective spacing between micron-level features 115E in the cross-process direction. Another alternative arrangement is shown in FIG. 9, where scratcher 110F includes multiple micron-level features 115F arranged in a matrix (i.e., multiple rows) on a base structure 112F. With this arrangement, the rows of micron-level features 115F are aligned in the cross-process (Y-axis) direction during processing with the features of adjacent rows being offset, whereby movement between scratcher 110E and the target substrate in the process direction generates ridge-type textures 106J' and closely spaced grooves 107J, as shown in FIG. 10(C).

According to other alternative embodiments of the present invention, the micron-level features of each scratcher are shaped in accordance with the desired texture. FIG. 10(A) depicts a scratcher 110G disposed over a substrate 101G, and illustrates rectangular micron-level features 115G disposed in a single row used to form one of rectangular, trapezoidal, or triangular grooves 107G, with substantially angular or more or less rounded corners, having a depth D1 in the range of 10 nm and 500 nm, and a width W1 in the range of 10 nm and 2000 nm. FIG. 10(B) depicts a scratcher 110H disposed over a substrate 101H, and illustrates pointed micron-level features 115H used to form V-shaped grooves 107G having depth D1 and width W1. FIG. 10(C) depicts a scratcher 110J disposed over a substrate 101J, wherein pointed micron-level features 115J-1 and 115J-2 are arranged in offset rows (similar to that shown in FIG. 9) to form V-shaped grooves 107J separating adjacent ridges 106J' having a height H1 and a width W2 in ranges similar to those described above.

Figure 11:
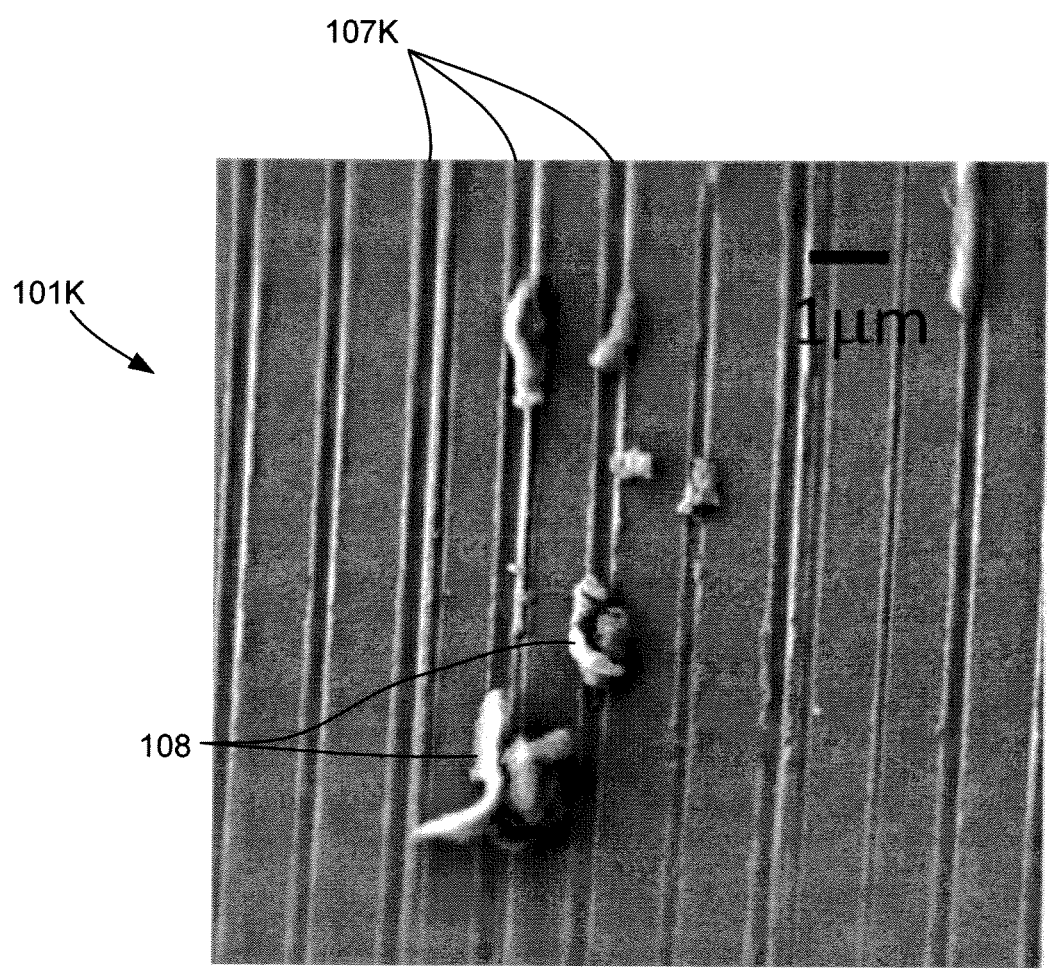
FIG. 11 is a scanning-electron micrograph showing the top of a structure produced in accordance with an exemplary embodiment of the present invention.
Figure 12:
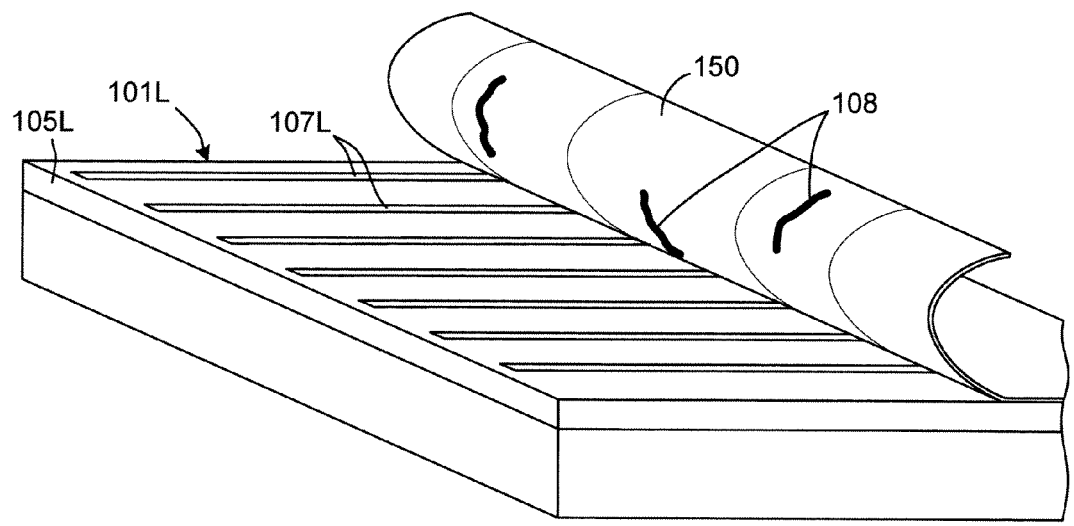
FIG. 12 is a top front perspective view showing a modified assembly for producing devices according to an exemplary embodiment of the present invention.
Figure 13:
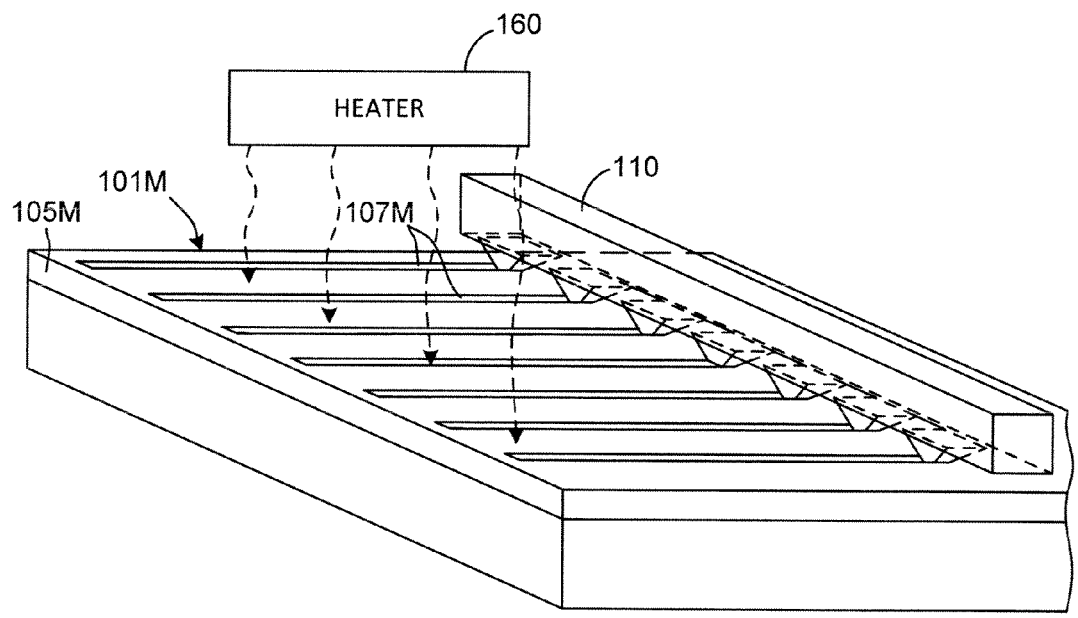
FIG. 13 is a top front perspective view showing another modified assembly for producing devices according to an exemplary embodiment of the present invention.

FIG. 11 is a scanning electron micrograph showing substrate 101K having textures (grooves) 107K formed in accordance with the various methods set forth above. Specifically, FIG. 11 shows surface debris 108 that can sometimes be produced on upper surface of substrate 101K during the scratching process utilized in the various methods set forth above, where the presence of debris 108 may impede optimal performance of a device including substrate 101K. According to alternative embodiments of the present invention, the method either includes an additional procedure for removing debris 108, or modified to avoid (prevent) debris from forming during the scratching process. For example, FIG. 12 shows a method in which debris 108 is removed by applying and removing an adhesive film (e.g., similar to Scotch tape) 150 after a scratcher has been moved across substrate 101L to form grooves 107L in surface material layer 105L in the manner described above. Alternative optional procedures for removing debris after the scratching (moving) process include: performing an etching process, performing ultrasonic agitation, rubbing the substrate surface with a soft material or a fine polishing pad, heat treating the substrate, directing a high pressure fluid jet onto the substrate, and flattening the debris onto the substrate using a knife or a roller. In addition, debris removal may be performed simultaneously with the moving process, e.g., by providing the scratcher with a debris removal device (such as a knife edge disposed at the sides of the scratcher) that is positioned to remove the debris as it is formed during the scratching (moving) process. According to other optional approaches, the formation of debris is suppressed or avoided entirely by performing the scratching process at temperatures that cause the surface material layer to soften (i.e., become plastic). For example, FIG. 13 shows a modified assembly 100L in which a heater 160 is utilized to heat (indicated by the curved-dashed arrows) surface material layer 105M to a suitable temperature (i.e., a temperature that causes the surface material to soften (i.e., change from a rigid solid state to a pliable or liquid state) before scratcher 110 forms grooves 107L in the manner described above. Another alternative debris suppression process involves performing the scratching operation through a protective layer, such as a photoresist coating, that prevents debris from curling upward away from the substrate and forming the type of debris shown in FIG. 11. In this case, the protective layer is removed following the scratching procedure.

Figure 14:
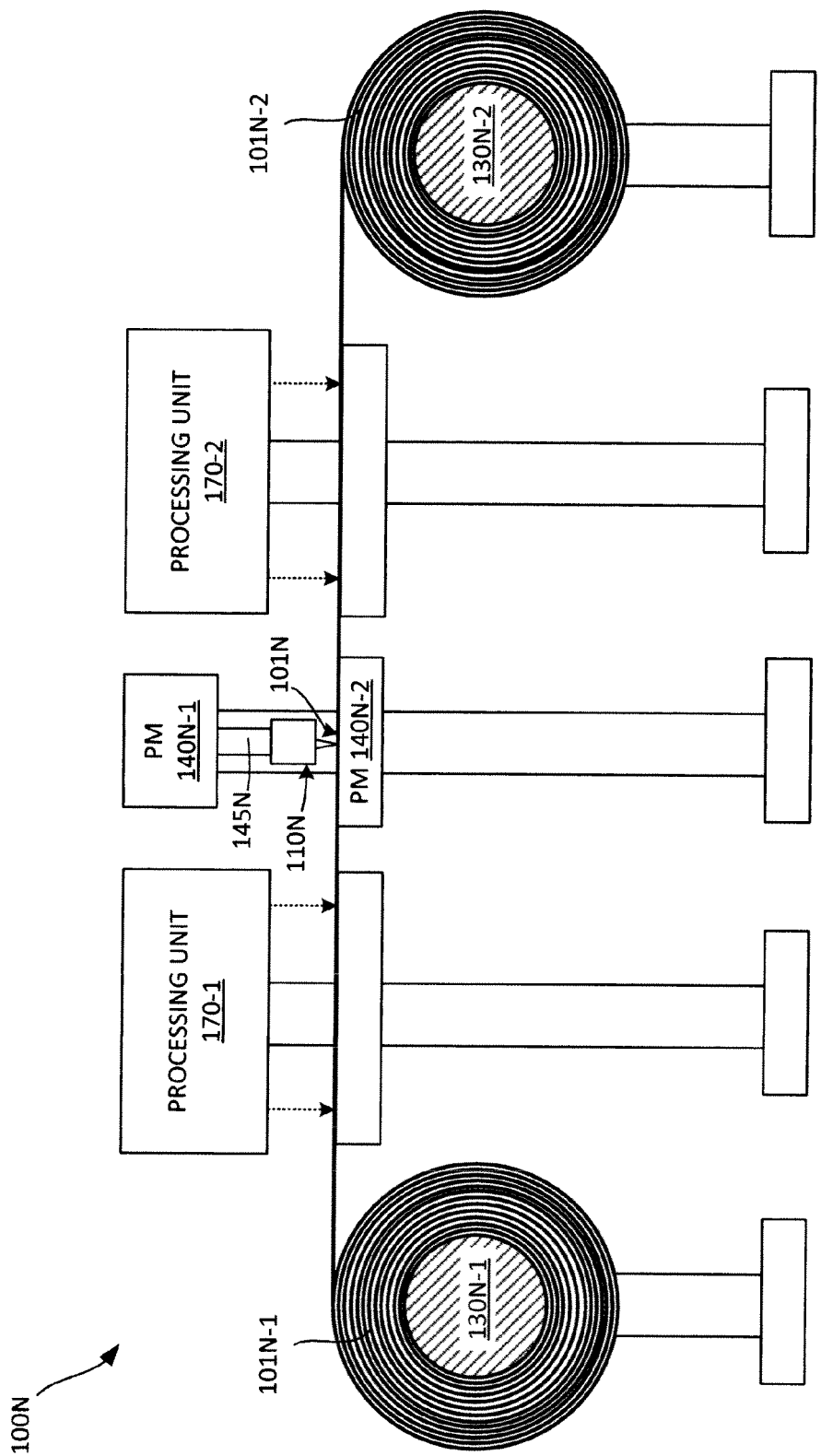
FIG. 14 is a front view showing a modified assembly for producing devices according to another exemplary embodiment of the present invention.

A FIG. 14 shows a simplified production assembly 100N according to a specific embodiment of the present invention, wherein the novel method is performed in the context of a high-throughput production line for producing solar cells. Specifically, assembly 100N is arranged to process a flexible sheet portion 101N extending between a first rolled portion 101N-1 disposed on a first roller 130N-1 and second rolled portion 101N-2 disposed on a second roller 130N-2, where first rolled portion 101N-1 comprises a blank (substantially unprocessed) flexible sheet material, and second rolled portion 101N-2 comprises a processed form of the flexible sheet material. Scratcher 110N, which is implanted using any of the various scratcher types described herein, is maintained in a stationary position between first and second rolled portions 101N-1 and 101N-2, and is attached to an upper positioning mechanism (PM) 140-1, which controls scratcher 110N in the manner described above. The flexible sheet is fed by way of rollers 130N-1 and 130N-2 (e.g., using a motor, not shown) such that flexible sheet portion 101N is disposed to pass between scratcher 110N and a lower positioning mechanism (PM) 140-2 as it is conveyed from first rolled portion 101N-1 to second rolled portion 101N-2. One or more upstream processing units 170-1 and one or more downstream processing units 170-2 are disposed upstream/downstream from scratcher 100N to process flexible sheet portion 101N in accordance with known processing techniques as described below.

Assembly 100N (FIG. 14) illustrates how the present invention may be implemented in an existing high-throughput production line utilized to produce, for example, solar cells, by facilitating one or more processes to be performed before and after the scratching process. For example, upstream processing units 170-1 may be utilized to deposit or otherwise process the surface material layer, which is then scratched by way of scratcher 110N, and then downstream processing units 170-2 is used to deposit one or more second materials on a portion of the flexible sheet located downstream from scratcher 110N that fill the elongated parallel nanostructure grooves (and cover the nanostructure ridges) and form a functional layer covering the surface material layer. The following exemplary specific embodiments illustrate various specific devices that may be produced using these techniques.

Figure 15:
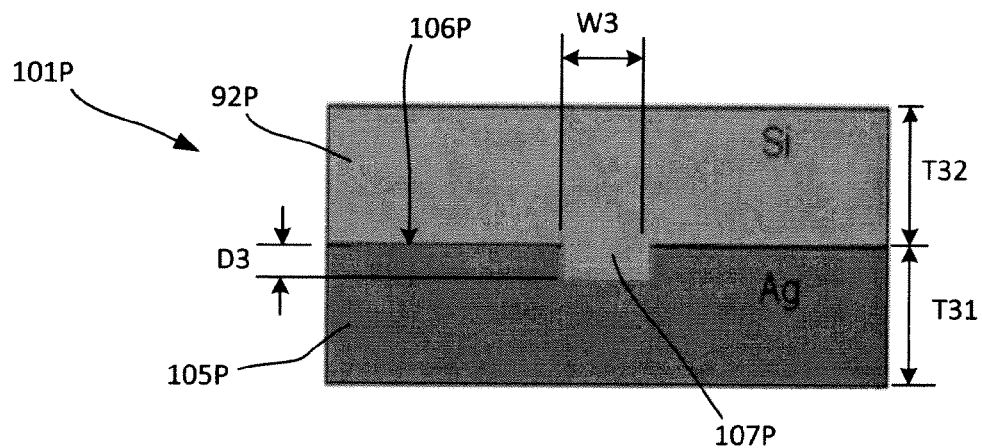
FIG. 15 is a simplified cross-sectional side view showing a device produced in accordance with an exemplary embodiment of the present invention.

FIG. 15 is a cross-sectional side view showing a processed substrate (device) 101P that is produced by assembly 100N (FIG. 14) according to a first specific embodiment. Device 101P includes a surface material layer 105P made up of one or more plasmonic metals (e.g., Ag, Au, Al, or Cu). In alternative embodiments plasmonic surface material layer 105P is formed on a base layer (not shown) by way of upstream processing unit 170-1, or serves as both the base and surface layer of substrate 101P. Outer surface 106P of plasmonic surface material layer 105P is scratched by scratcher 110N (FIG. 14) to form one or more grooves 107P having a width W3 of approximately 100 nm and a depth D3 of approximately 50 nm. Device 101P is then passed under downstream processing unit 170-2, which deposits a functional (second) material onto the outer surface 106P that fills elongated parallel nanostructure grooves 107P and forms a functional layer 92P covering surface material layer 105P.

Figure 16:
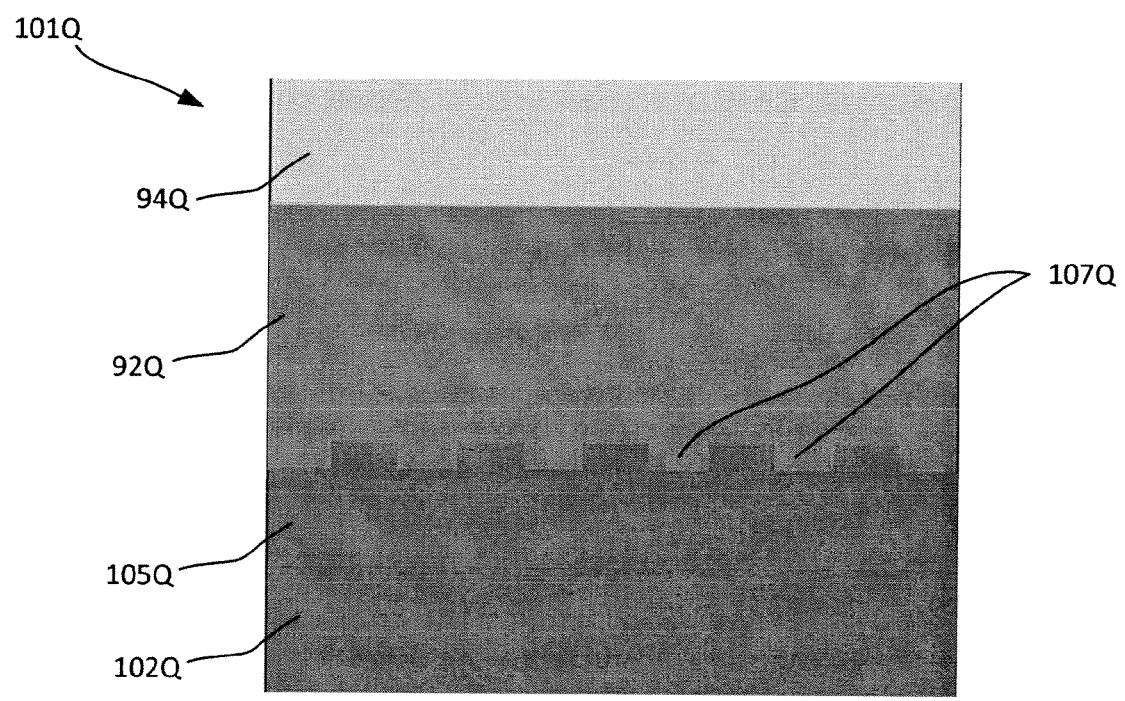
FIG. 16 is a simplified cross-sectional side view showing a device produced in accordance with another exemplary embodiment of the present invention.

FIG. 16 is a cross-sectional side view showing a processed substrate (device) 101Q that is produced by assembly 100N (FIG. 14) according to a second specific embodiment. Device 101Q is similar to device 101P in that it includes a surface material layer 105Q made up of a metal film (e.g., a plasmonic or other metal) that is disposed on a base layer 102Q (e.g., silicon, ITO coated glass, or an ITO coated polymeric substrate) by way of upstream processing unit 170-1, where the metal film is then processed (scratched) by scratcher 110N (FIG. 14) to form grooves 107Q, and then downstream processing unit 170-2 is employed to deposit a photovoltaic (second) material (e.g., amorphous silicon (a-Si)) onto the outer surface 106Q that fills elongated parallel nanostructure grooves 107Q and forms a photoabsorber (functional) layer 92Q covering surface material layer 105Q. Downstream processing unit 170-2 is then employed to deposit an optional transparent electrode material (e.g., ITO) layer 94Q over photoabsorber layer 92Q to facilitate photovoltaic operation of device 101Q.

Figure 17:
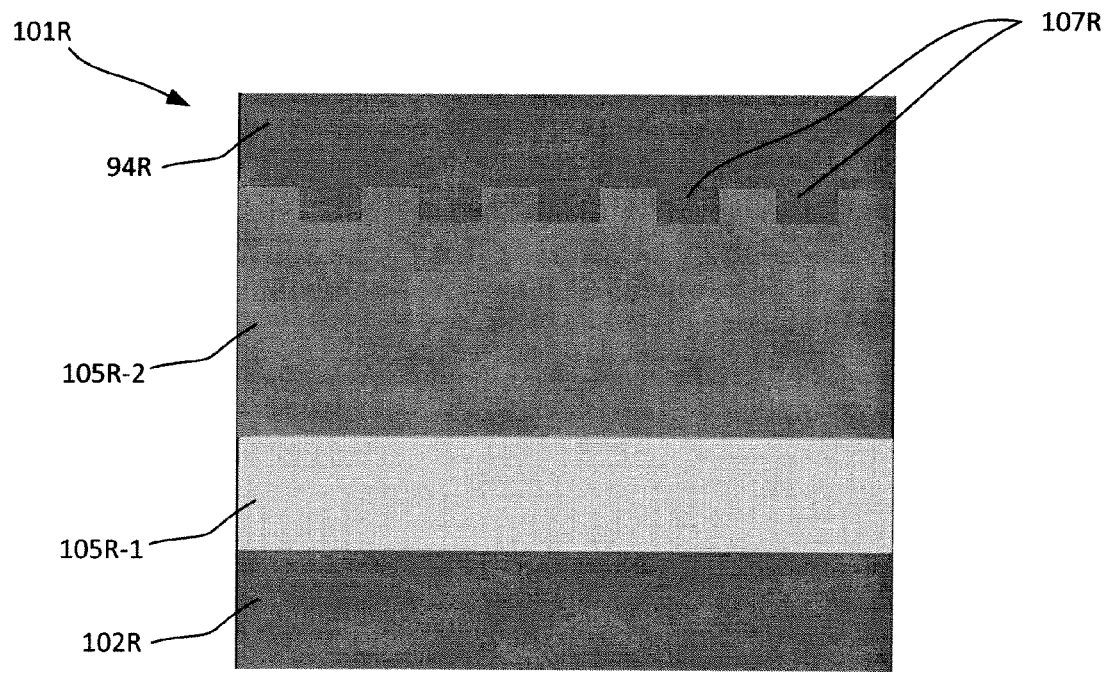
FIG. 17 is a simplified cross-sectional side view showing a device produced in accordance with yet another exemplary embodiment of the present invention.

FIG. 17 is a cross-sectional side view showing a processed substrate (device) 101R that is produced by assembly 100N (FIG. 14) according to a third specific embodiment in which a semiconductor material, not a metal, is processed by scratcher 110N. In this embodiment two layers of surface material are formed on base structure 102R by upstream processing unit 170-1 (FIG. 14), where upper surface material layer 105R-2 is a semiconductor material layer (e.g., CdTe or organic semiconductor), and is disposed on a transparent conductive layer 105R-1 (e.g., ITO). Semiconductor material layer 105R-2 is then processed by scratcher 110N (FIG. 14) in the manner described above to generate grooves 107R, and then downstream processing unit 170-2a deposits a metal (e.g., Ag) by sputtering or other known method such that the metal forms fills elongated parallel nanostructure grooves 107R and forms a back contact layer 92R over semiconductor material layer 105R-2.

Figure 18:
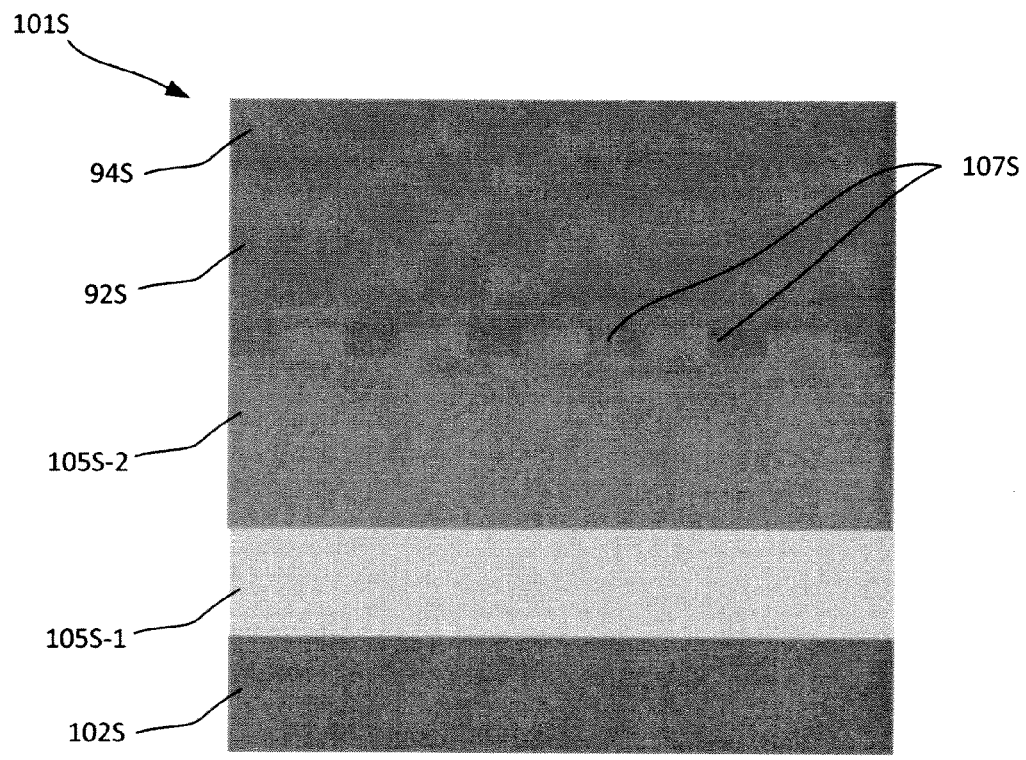
FIG. 18 is a simplified cross-sectional side view showing an ordered heterojunction organic solar cell produced in accordance with yet another exemplary embodiment of the present invention.

FIG. 18 is a cross-sectional side view showing an ordered heterojunction organic solar cell 101S that is produced by assembly 100N (FIG. 14) according to a fourth specific embodiment. This embodiment begins, using upstream processing unit 170-1 (FIG. 14), by forming a first semiconductor (e.g., donor) layer 105S-2 (e.g., spin-coat polymer or evaporated small molecules) on a transparent electrode layer 105S-1 (e.g., ITO) that is disposed on a base substrate 102S. The subtractive "scratching" method described herein is then performed to scratch portions of donor layer 105S-2, whereby grooves 107S are formed. Using downstream processing unit 170-2 (FIG. 14), a second (e.g., acceptor) layer 92S is then formed (e.g., a spin-cast polymer or evaporated small molecules) over the scratched surface to complete ordered heterojunction structure, and then a back electrode layer 94S (e.g., a metal) is formed on acceptor layer 92S. A benefit of forming ordered heterojunction organic solar cell 101S with nano-scale textures using the methodology of the present invention over conventional ordered heterojunction organic solar cells is more efficient carrier collection.

Although the present invention has been described with respect to certain specific embodiments, it will be clear to those skilled in the art that the inventive features of the present invention are applicable to other embodiments as well, all of which are intended to fall within the scope of the present invention. For example, although the scratching process is described as being performed on a flattened portion of the flexible substrate material in the roll-to-roll embodiment of FIG. 14, assembly 100N could be positioned over one of the rolls 100N-1 and 100N-2, and the scratching process may be performed on the rolled portion of the substrate material.

The invention claimed is:

1. A method for producing textures on a substrate comprising a surface material layer, the method comprising:
  pressing a scratcher against the substrate, the scratcher including a base structure and a plurality of micron-level features protruding away from the base structure, wherein pressing the scratcher comprises biasing the scratcher against the substrate such that at least some of the plurality of micron-level features pierce an outer surface of the surface material layer; and
  moving the scratcher relative to the substrate such that at least some of the plurality of micron-level features displace portions of said surface material layer in a manner that produces parallel elongated grooves defined in the surface material layer and separated by parallel elongated ridges formed by remaining portions of the surface material layer,
  wherein the plurality of micron-level features are arranged in a row on the base structure, and
  wherein positioning the scratcher over the substrate comprises aligning the row of said micron-level features in one of a cross-process direction that is substantially perpendicular to a process direction of said relative movement between said scratcher and said substrate, and a diagonal direction that is diagonal to said one of the cross-process direction and the process direction.

2. The method according to claim 1, wherein moving scratcher relative to the substrate comprises maintaining the scratcher in a stationary position over the substrate while utilizing a conveying mechanism to translate the substrate horizontally under the scratcher.

3. The method according to claim 1, wherein moving scratcher relative to the substrate comprises maintaining the substrate in a stationary position under the scratcher, and causing a conveying mechanism to translate the scratcher horizontally over the substrate.

4. The method according to claim 1, wherein pressing the scratcher against the substrate comprises connecting the scratcher to a positioning mechanism and supporting the substrate on a platform, and controlling the positioning mechanism such that the plurality of micron-level features apply a force against the surface material layer.

5. The method according to claim 4, wherein moving the scratcher relative to the substrate comprises controlling the positioning mechanism to maintain said force on said substrate during said moving.

6. A method for producing textures on a substrate comprising a surface material layer, the method comprising:
  pressing a scratcher against the substrate, the scratcher including a base structure and a plurality of micron-level features protruding away from the base structure, wherein pressing the scratcher comprises biasing the scratcher against the substrate such that at least some of the plurality of micron-level features pierce an outer surface of the surface material layer; and
  moving the scratcher relative to the substrate such that at least some of the plurality of micron-level features displace portions of said surface material layer in a manner that produces parallel elongated grooves defined in the surface material layer and separated by parallel elongated ridges formed by remaining portions of the surface material layer,
  wherein the substrate comprises a flexible sheet portion extending between a first rolled portion and second rolled portion, and
  wherein moving the scratcher relative to the substrate comprises feeding the flexible sheet portion from the first rolled portion to the second rolled portion such that the flexible sheet portion passes under the scratcher.

7. The method according to claim 6,
  wherein the base structure of the scratcher comprises a rigid substrate material,
  wherein the plurality of micron-level features comprise patterned portions of the rigid substrate material disposed on a frontside surface of the rigid substrate material, and
  wherein pressing the scratcher comprises pressing a backside surface of base structure such that the micron-level features are pressed toward the substrate.

8. The method according to claim 6,
  wherein the base structure of the scratcher comprises one of a rigid substrate material and a flexible substrate material,
  wherein the plurality of micron-level features comprise a plurality of a hard material grains that are adhered to a frontside surface of the base structure, and
  wherein pressing the scratcher comprises pressing a backside surface of base structure such that the micron-level features are pressed toward the substrate.

9. A method for producing textures on a substrate comprising a surface material layer, the method comprising:
  pressing a scratcher against the substrate, the scratcher including a base structure and a plurality of micron-level features protruding away from the base structure, wherein pressing the scratcher comprises biasing the scratcher against the substrate such that at least some of the plurality of micron-level features pierce an outer surface of the surface material layer; and
  moving the scratcher relative to the substrate such that at least some of the plurality of micron-level features displace portions of said surface material layer in a manner that produces parallel elongated grooves defined in the surface material layer and separated by parallel elongated ridges formed by remaining portions of the surface material layer,
  wherein the base structure of the scratcher comprises a single-piece crystal substrate, wherein the plurality of micron-level features comprise a plurality of exposed vertices of the single-piece crystal disposed on a frontside surface of the single-piece crystal substrate, and wherein pressing the scratcher comprises pressing a backside surface of the single-piece crystal substrate such that the micron-level features are pressed toward the substrate.

10. A method for producing textures on a substrate comprising a surface material layer, the method comprising:

pressing a scratcher against the substrate, the scratcher including a base structure and a plurality of micron-level features protruding away from the base structure, wherein pressing the scratcher comprises biasing the scratcher against the substrate such that at least some of the plurality of micron-level features pierce an outer surface of the surface material layer; and moving the scratcher relative to the substrate such that at least some of the plurality of micron-level features displace portions of said surface material layer in a manner that produces parallel elongated grooves defined in the surface material layer and separated by parallel elongated ridges formed by remaining portions of the surface material layer, wherein the plurality of micron-level features are arranged in a plurality of offset rows on the base structure, and wherein positioning the scratcher over the substrate comprises aligning the plurality of rows of said micron-level features in one of a cross direction that is substantially perpendicular to a moving direction of said relative movement between said scratcher and said substrate, and a diagonal direction that is diagonal to said one of the cross-process direction and the process direction.

11. The method according to claim 1, wherein moving the scratcher relative to the substrate comprises controlling the scratcher such that said plurality of micron-level features form one of V-shaped, rounded, trapazoidal and rectangular grooves having a depth in the range of 10 nm and 500 nm, and a width in the range of 10 nm and 2000 nm.

12. A method for producing textures on a substrate comprising a surface material layer, the method comprising:

pressing a scratcher against the substrate, the scratcher including a base structure and a plurality of micron-level features protruding away from the base structure, wherein pressing the scratcher comprises biasing the scratcher against the substrate such that at least some of the plurality of micron-level features pierce an outer surface of the surface material layer; and moving the scratcher relative to the substrate such that at least some of the plurality of micron-level features displace portions of said surface material layer in a manner that produces parallel elongated grooves defined in the surface material layer and separated by parallel elongated ridges formed by remaining portions of the surface material layer, further comprising removing debris from said substrate utilizing one of:

a) applying and removing an adhesive film after said moving;

b) performing an etching process after said moving;

c) performing ultrasonic agitation after said moving;

d) rubbing said substrate with one of a soft material and a fine polishing pad;

e) heat treating said substrate after said moving;

f) directing a high pressure fluid jet onto said substrate after said moving;

g) flattening said debris onto said substrate using one of a knife and a roller; and h) providing said scratcher with a debris removal device that removes said debris during said moving.

13. A method for producing textures on a substrate comprising a surface material layer, the method comprising:

pressing a scratcher against the substrate, the scratcher including a base structure and a plurality of micron-level features protruding away from the base structure, wherein pressing the scratcher comprises biasing the scratcher against the substrate such that at least some of the plurality of micron-level features pierce an outer surface of the surface material layer; and moving the scratcher relative to the substrate such that at least some of the plurality of micron-level features displace portions of said surface material layer in a manner that produces parallel elongated grooves defined in the surface material layer and separated by parallel elongated ridges formed by remaining portions of the surface material layer, further comprising, prior to said moving, performing one of:

a) utilizing a heater to soften said surface material layer; and b) applying a protective layer over the surface material layer.

14. The method according to claim 1, further comprising depositing one or more second materials onto the outer surface of the surface material layer such that the one or more second materials fill said elongated parallel nanostructure grooves and forms a functional layer covering the surface material layer.

15. The method according to claim 14,
wherein the surface material layer comprises a metal film disposed on a base layer, and
wherein depositing the second material comprises depositing a photovoltaic material to form a photoabsorber layer over the metal film.

16. The method according to claim 15, further comprising depositing a transparent conductive layer over the photoabsorber layer.

17. The method according to claim 16,
wherein the surface material layer comprises a semiconductor material layer disposed on a transparent conductive layer; and
wherein depositing the second material comprises depositing a metal over the semiconductor material layer such that the metal fills said elongated parallel nanostructure grooves and forms a back contact layer over the semiconductor material layer.

18. The method according to claim 16,
wherein the surface material layer comprises a first organic electronic material layer disposed on a first conductive layer;
wherein depositing the second material comprises depositing a second organic electronic material layer on the first organic electronic material layer such that the second organic electronic material enters the elongated parallel nanostructure grooves and forms a heterojunction interface with the first organic electronic material layer; and
wherein the method further comprises depositing a second conductive layer over the second organic electronic material layer.

* * * * *